(12) United States Patent
Sakakura

(10) Patent No.: US 7,825,663 B2
(45) Date of Patent: Nov. 2, 2010

(54) GRADIENT COIL, MAGNETIC RESONANCE IMAGING APPARATUS AND GRADIENT COIL MANUFACTURING METHOD

(75) Inventor: Yoshitomo Sakakura, Nasushiobara (JP)

(73) Assignees: Kabushiki Kaisha Toshiba, Minato-Ku, Tokyo (JP); Toshiba Medical Systems Corporation, Otawara-Shi, Tochigi-Ken (JP)

(*) Notice: Subject to any disclaimer, the term of this patent is extended or adjusted under 35 U.S.C. 154(b) by 103 days.

(21) Appl. No.: 12/360,208

(22) Filed: Jan. 27, 2009

(65) Prior Publication Data

US 2009/0189607 A1 Jul. 30, 2009

(30) Foreign Application Priority Data

Jan. 30, 2008 (JP) ............................. 2008-019078
Jan. 19, 2009 (JP) ............................. 2009-009040

(51) Int. Cl.
*G01V 3/00* (2006.01)
(52) U.S. Cl. ..................... 324/318; 324/322
(58) Field of Classification Search ............... 324/318, 324/322
See application file for complete search history.

(56) References Cited

U.S. PATENT DOCUMENTS

| | | | | | |
|---|---|---|---|---|---|
| 5,289,151 | A | * | 2/1994 | Turner | 335/299 |
| 6,054,854 | A | * | 4/2000 | Kawamoto | 324/318 |
| 6,320,382 | B1 | * | 11/2001 | Anderson | 324/318 |
| 6,456,076 | B1 | * | 9/2002 | Joseph | 324/318 |
| 6,515,479 | B1 | * | 2/2003 | Arz et al. | 324/318 |
| 7,109,712 | B2 | * | 9/2006 | Boskamp | 324/318 |
| 7,468,644 | B2 | * | 12/2008 | Axel | 333/219 |

FOREIGN PATENT DOCUMENTS

| | | |
|---|---|---|
| JP | 10-172821 | 6/1998 |
| JP | 2000-166893 | 6/2000 |

* cited by examiner

*Primary Examiner*—Louis M Arana
(74) *Attorney, Agent, or Firm*—Nixon & Vanderhye PC

(57) ABSTRACT

Provided is a gradient coil capable of suppressing generation of an unnecessary magnetic field component while ensuring the readiness of conducting wire winding work. The gradient coil includes a cylindrical bobbin round which the conducting wire is wound; and a winding part formed by winding the conducting wire round the bobbin by a plurality of turns, wherein the winding part has a first winding part in which the conducting wire is wound round the bobbin orthogonal to the axis of the bobbin in a circumferential direction of the bobbin and a second winding part in which the conducting wire is spirally wound round the bobbin, skewing relative to the axis of the bobbin in the circumferential direction of the bobbin.

20 Claims, 10 Drawing Sheets

FIG. 4  LANE CHANGE WINDING (PRIOR ART)

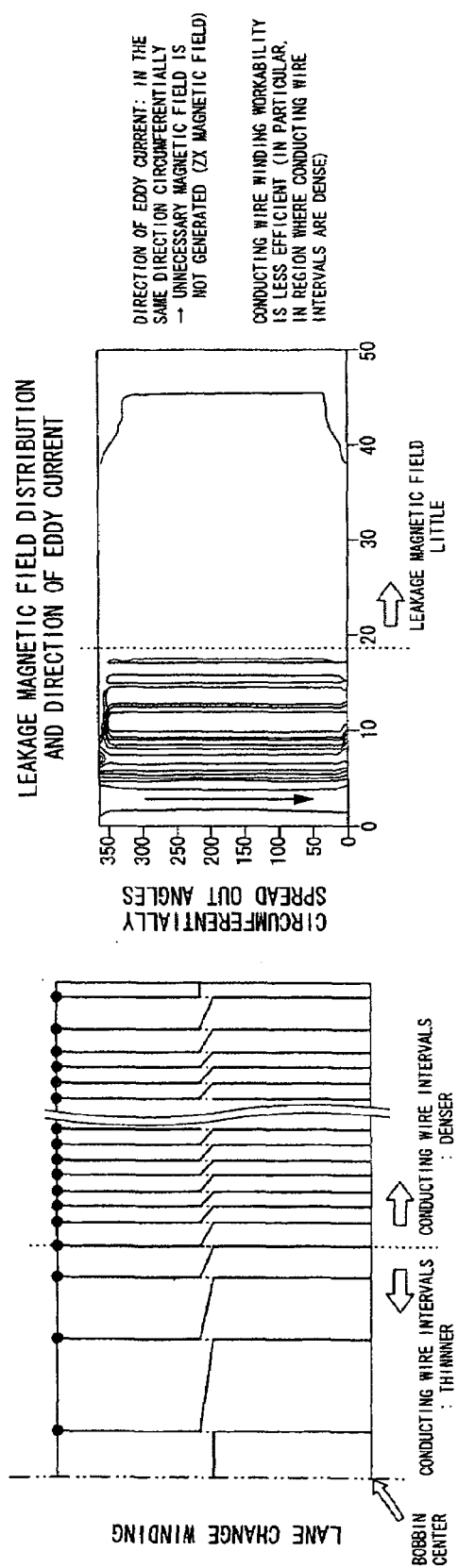
FIG. 6A
FIG. 6B
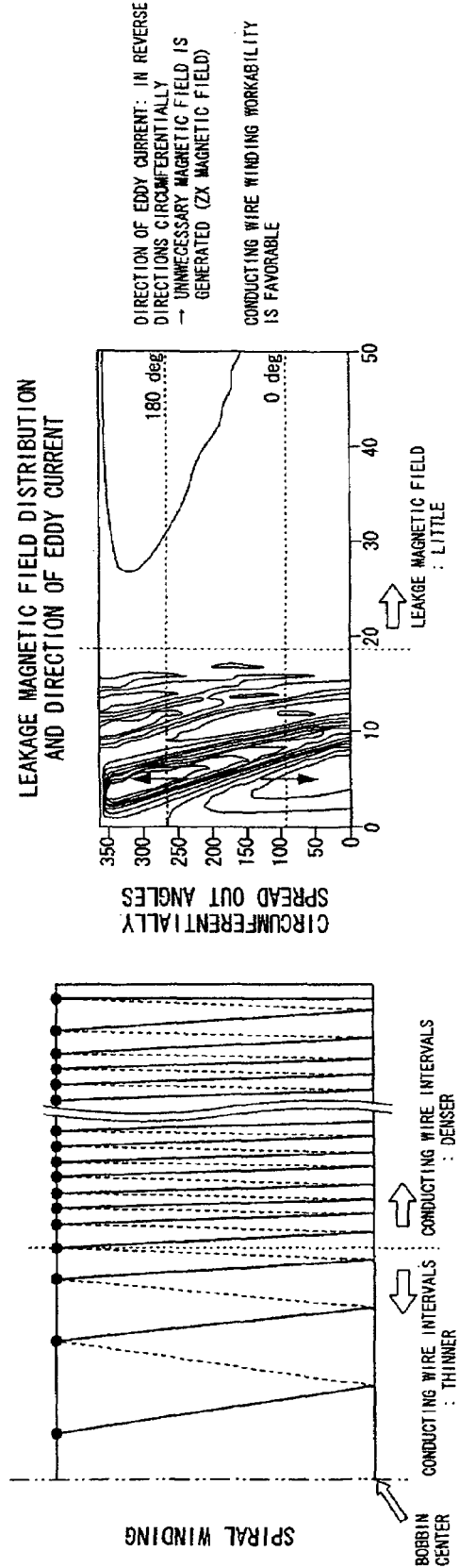
FIG. 6C
FIG. 6D

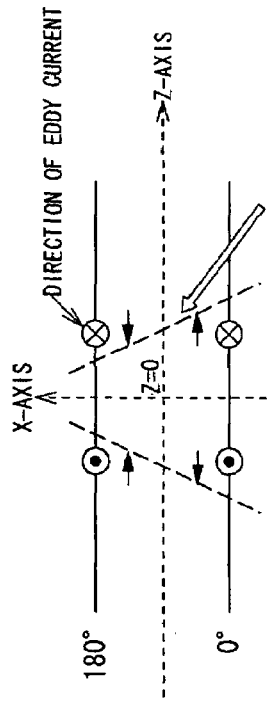
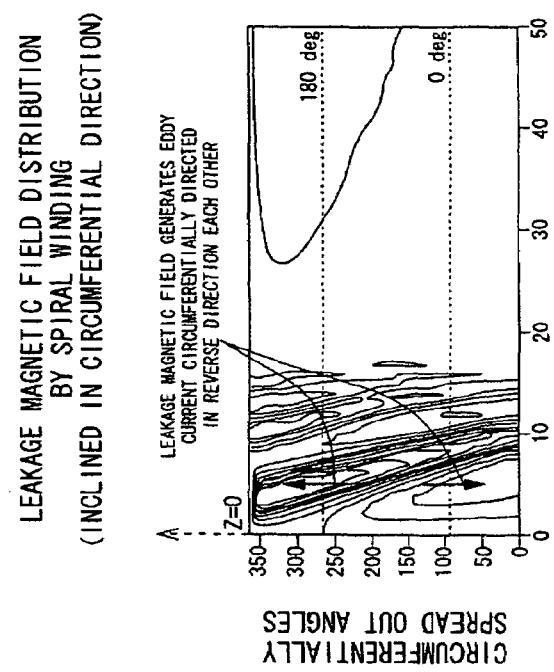
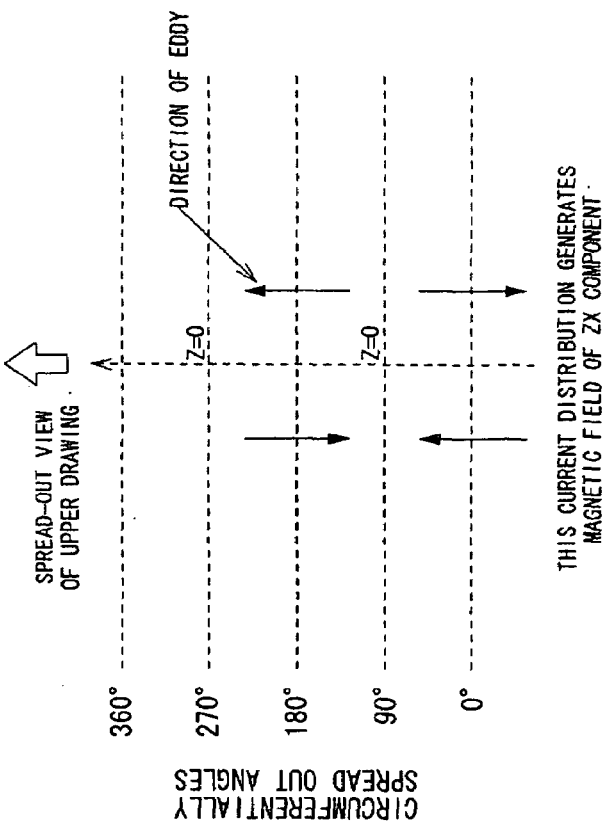

| NO. | WINDING TYPE | MAGNETIC FIELD COMPONENT: VALUES IN ( ) INDICATE RATIO IN PERCENTAGE (%) RELATIVE TO Z COMPONENT | | | PARTICULAR |
|---|---|---|---|---|---|
| | | Z | ZX (UNNECESSARY MAGNETIC FIELD) | ZY (UNNECESSARY MAGNETIC FIELD) | |
| 1 | ENTIRE REGION SPIRAL WINDING (PRIOR ART) | 4756.5 | -22.9 (-0.48) | -5.8 (-0.12) | GOOD WORKABILITY, BUT LARGE UNNECESSARY MAGNETIC FIELD COMPONENT |
| 2 | PARTIAL SPIRAL WINDING (LANE CHANGE WINDING PLUS SPIRAL WINDING) | 4754.9 | 10.8 (0.23) | 0.1 (0.00) | GOOD WORKABILITY AND SMALL UNNECESSARY MAGNETIC FIELD COMPONENT |

FIG. 11

GRADIENT COIL, MAGNETIC RESONANCE IMAGING APPARATUS AND GRADIENT COIL MANUFACTURING METHOD

BACKGROUND

1. Field

The present invention relates to a gradient coil, a magnetic resonance imaging apparatus and a gradient coil manufacturing method. In particular, the invention relates to a gradient coil adapted to form a gradient magnetic field in a main magnetic field direction, a magnetic resonance imaging apparatus including this gradient coil and a method of manufacturing this gradient coil.

2. Description of the Related Art

In a magnetic resonance imaging apparatus (MRI apparatus) for medical use, a main magnetic field is formed with a superconductive magnet or the like, and a Z-gradient coil to form a gradient magnetic field in the main magnetic field direction is employed. Further, a X-gradient coil and a Y-gradient coil adapted to respectively form gradient magnetic fields in X-axis and Y-axis directions orthogonal to the main magnetic field direction are employed.

The present invention relates to the Z-gradient coil among these coils. Therefore, hereinafter, a "gradient coil" will be referred to as the Z-gradient coil in the Z-axis direction.

The magnetic resonance imaging apparatus has a cylindrical bobbin which is substantially similar to a cylindrical space into which a person to be inspected is conveyed. The gradient coil is formed by winding a conducting wire round the bobbin in its circumferential direction by a plurality of turns. In general, the pitches (the intervals among the respective turns of the conducting wire) of respective turns are set irregular. For example, the pitches reach the thinnest states at the center of the axis of the bobbin, become gradually denser from the center of the bobbin axis toward one end thereof, then reach the densest states at a predetermined distance away from the center of the bobbin axis and become gradually thinner after that. Likewise, the conducting wire is wound round the bobbin such that the pitches of respective turns become gradually denser first and then become gradually thinner from the center of the bobbin axis toward the other end thereof.

The conducting wire is wound symmetric relative to the center of the bobbin axis and the direction of a current flowing from the center of the bobbin axis toward one end thereof is reversed relative to the direction of a current flowing from the center of the bobbin axis toward the other end thereof. As a result, there can be formed magnetic fields directed in positive and negative directions with the center of the bobbin axis set as the origin and there is formed a magnetic field which is gradient in the bobbin axis direction as a whole.

The pitches of respective turns of the conducting wire are made irregular in order to increase the linearity of the gradient magnetic field and the positions of respective turns are analytically determined in advance.

As a conducting wire winding method, two methods called "spiral winding" and "lane change winding" are well known as disclosed in JP-A 10-172821.

The spiral winding is a method of literally spirally winding a conducting wire such that the positions of respective turns align with analytically determined positions thereof at predetermined points on the circumference of the bobbin. In the spiral winding, the conducting wire skews in the axial direction on the circumferential surface of the bobbin in one turn and the position of the conducting wire is continuously shifted in the Z-axis direction.

On the other hand, in the lane change winding, the position of the conducting wire is not shifted in the Z-axis direction in one turn, that is, the position is fixed. When the conducting wire is moved from one turn to the next turn, the position of the conducting wire is stepwise shifted (lane-changed) in the Z-axis direction at specific positions on the circumference of the bobbin. In the lane change winding, the position of the conducting wire is discretely shifted in the Z-axis direction.

As disclosed in JP-A 10-172821, in general, the lane change winding is inferior to the spiral winding in workability. The reason therefor lies in that, in the lane change winding, work in a position where the conducting wire is to be lane-changed requires great skill and the workability is reduced particularly in a region where the pitches of respective turns are dense.

To the contrary, the spiral winding is excellent in workability. By the spiral winding, the conducting wire can be wound in a shorter time period than that attained by the lane change winding. As a result, it becomes possible to provide a low-cost gradient coil. JP-A 10-172821 discloses a technique relating to a gradient coil which is superior to a conventional spiral winding method in performance, though the spiral winding which is excellent in workability is adopted, that is, capable of realizing a performance closer to a design value.

Incidentally, the gradient coil for the Z-axis aims to form a gradient magnetic field only in the Z-axis direction and hence it is not preferable to generate magnetic field components in the X-axis and Y-axis directions by this gradient coil. Hereinafter, the magnetic field components generated in the X-axis and Y-axis directions by this gradient coil will be referred to as unnecessary magnetic field components.

In the above mentioned lane change winding, the position of the conducting wire is not shifted in the Z-axis direction in one turn, so that the conducting wire is always orthogonal to the Z-axis. Therefore, the magnetic field induced by a current flowing through the conducting wire is always directed in the Z-axis direction and hence, in principle, the magnetic field component does not generate in either the X-axis direction or the Y-axis direction. That is, it is known that, by the lane change winding, in principle, the unnecessary magnetic field component is not generated, and actually the unnecessary magnetic field component is substantially reduced to zero.

On the other hand, by the spiral winding, the conducting wire skews in the Z-axis direction on the circumferential surface of the bobbin in one turn. Thus, a magnetic field component directed in the X-axis or Y-axis direction, that is, an unnecessary magnetic field component is generated, albeit only slightly.

Recently, the diameter of the cylindrical space of a magnetic resonance imaging apparatus has been more and more increased, and the diameter of the gradient coil and the magnitude of the magnetic field generated by this coil have been also more and more increased accordingly. Likewise, the magnitude of the unnecessary magnetic field component induced by the spiral winding has been increased accordingly. As a result, in the gradient coil adopting the spiral winding, the magnitude of the unnecessary magnetic field component which has scarcely exerted a bad influence so far has been increased to such an extent that cannot be neglected.

SUMMARY OF THE INVENTION

Accordingly, the present invention has been made in view of the above-mentioned circumstances, and it is an object of the present invention to provide a gradient coil, a magnetic resonance imaging apparatus and a gradient coil manufacturing method capable of suppressing generation of an unnecessary magnetic field component while ensuring the readiness of conducting wire winding work.

In order to solve the above mentioned problems, according to an aspect of the present invention, there is provided a gradient coil including: a cylindrical bobbin; and a winding part formed by winding a conducting wire round the bobbin by a plurality of turns, wherein the winding part has a first winding part in which the conducting wire is wound round the bobbin orthogonal to the axis of the bobbin in a circumferential direction of the bobbin and a second winding part in which the conducting wire is spirally wound round the bobbin, skewing relative to the bobbin axis in the circumferential direction of the bobbin.

According to another aspect of the present invention, there is provided a magnetic resonance imaging apparatus including: a magneto-static field coil adapted to apply a magneto-static field to a person to be inspected; a gradient coil adapted to form a gradient magnetic field in a direction which is the same as the direction in which the magneto-static field is applied to apply the gradient magnetic field to the person to be inspected; a high frequency coil adapted to receive a magnetic resonance signal emitted from the person to be inspected; and a signal image processing unit adapted to process the received magnetic resonance signal to generate an image of the inside of the person to be inspected, wherein the gradient coil includes a cylindrical bobbin and a winding part formed by winding a conducting wire round the bobbin by a plurality of turns, and the winding part has a first winding part in which the conducting wire is wound round the bobbin orthogonal to the axis of the bobbin in a circumferential direction of the bobbin and a second winding part in which the conducting wire is wound round the bobbin, skewing relative to the bobbin axis in the circumferential direction of the bobbin.

According to another aspect of the present invention, there is provided a gradient coil manufacturing method of forming a winding part by winding a conducting wire round a cylindrical bobbin by a plurality of turns, the method including the steps of: (a) forming a first winding part by winding the conducting wire round the bobbin orthogonal to the axis of the bobbin in a circumferential direction of the bobbin and (b) forming a second winding part by spirally winding the conducting wire round the bobbin, skewing relative to the bobbin axis in the circumferential direction of the bobbin.

According to the gradient coil, the magnetic resonance imaging apparatus and the gradient coil manufacturing method of the present invention, generation of any unnecessary magnetic field component can be suppressed while ensuring the readiness of conducting wire winding work.

BRIEF DESCRIPTION OF THE DRAWINGS

The accompanying drawings, which are incorporated in and constitute a part of the specification, illustrate embodiments of the invention, and together with the general description given above and the detailed description of the embodiments given below, serve to explain the principles of the invention.

FIGS. 6A to 6D are diagrams showing the aspects of leakage magnetic field distribution and eddy current in the entire region lane change winding and the entire region spiral winding;

FIGS. 7A to 7C are diagrams illustrating a mechanism of generating unnecessary magnetic fields (a ZX magnetic field and a ZY magnetic field) in the entire region spiral winding;

FIG. 11 is a table showing an example of a result that the effect to reduce the unnecessary magnetic fields (the ZX magnetic field and the ZY magnetic field) brought about by the gradient coil according to the embodiment of the present invention has been analytically obtained.

DETAILED DESCRIPTION

Embodiments of a gradient coil, a magnetic resonance imaging apparatus and a gradient coil manufacturing method according to the present invention will be described with reference to the accompanying drawings.

Figure 1:
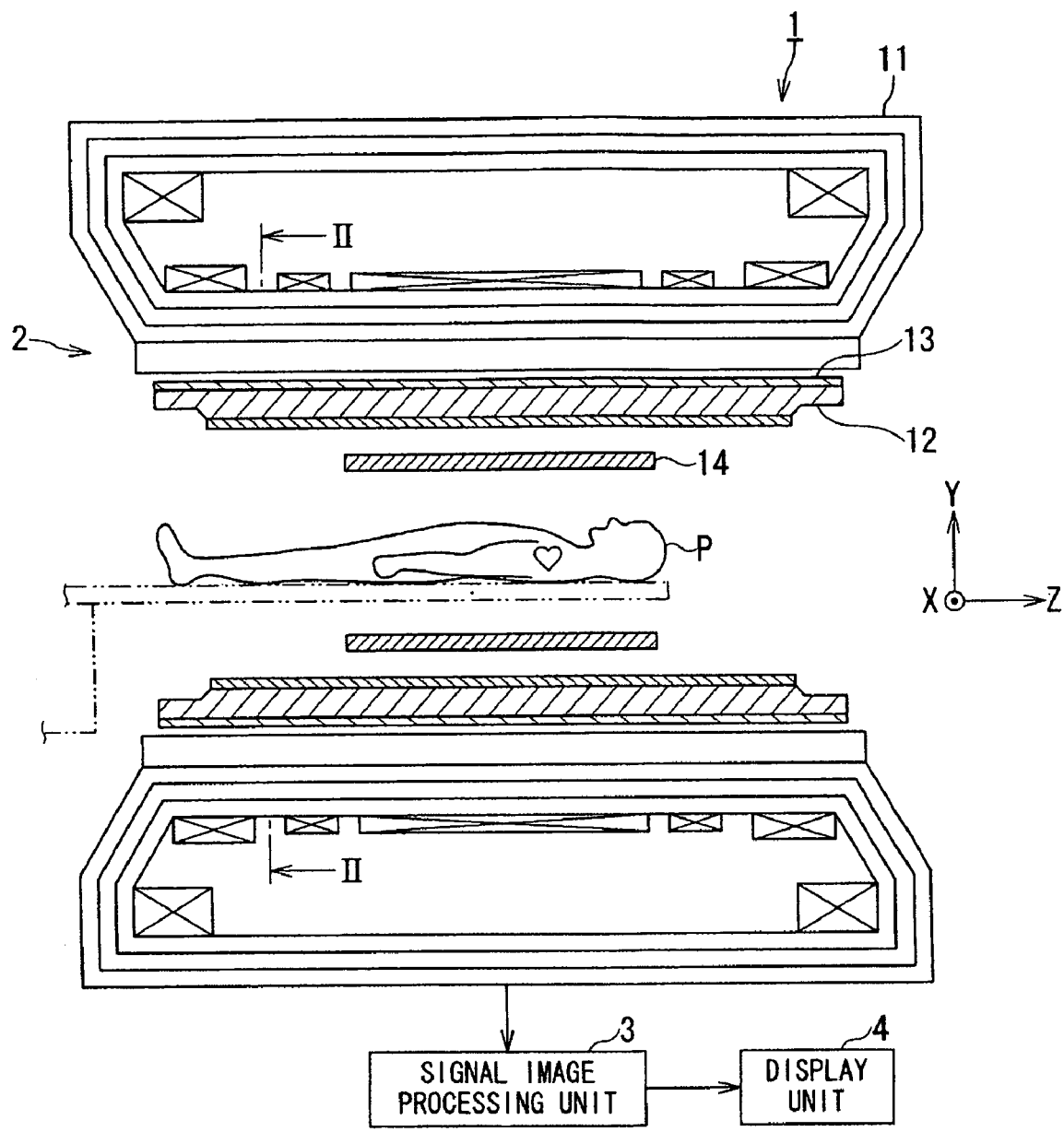
FIG. 1 is a diagram illustrating a configuration example of a magnetic resonance imaging apparatus according to an embodiment of the present invention.

FIG. 1 illustrates a configuration example of a magnetic resonance imaging apparatus (MRI apparatus) 1 according to an embodiment of the present invention. The magnetic resonance imaging apparatus 1 includes a gantry 2, a signal image processing unit 3, a display unit 4 and the like. In particular, FIG. 1 shows a detailed sectional structure of the gantry 2.

The gantry 2 is cylindrical as a whole and its central bore functions as a space for diagnosis and is designed such that a person to be inspected P can be conveyed into the bore for diagnosis.

The gantry 2 has a substantially cylindrical magneto-static field coil unit 11, a substantially cylindrical gradient coil unit 12 disposed in the bore of the magneto-static field coil unit 11, a shimming coil unit 13 attached onto, for example, the outer circumferential surface of the gradient coil unit 12, and an RF coil 14 disposed in the bore of the gradient coil unit 12. The person to be inspected P is put on a not shown bed top plate to be inserted into the bore (the space for use in diagnosis) formed in the RF coil 14.

The magneto-static field coil unit 11 is made of, for example, a superconductive magnet. A plurality of thermal radiation shielded containers and a single liquid helium container are contained in a vacuum container disposed on the outer side thereof and a superconductive coil is wound and disposed within the liquid helium container.

The gradient coil unit 12 is formed to serve as an actively shielded gradient coil (ASGC). The gradient coil unit 12 has coil assemblies respectively provided for X, Y and Z channels in order to generate pulsed gradient magnetic fields respectively in X-axis, Y-axis and Z-axis directions. For each channel, each of these coil assemblies has a shielded structure in which almost no gradient magnetic field leaks to the outside.

Figure 2:
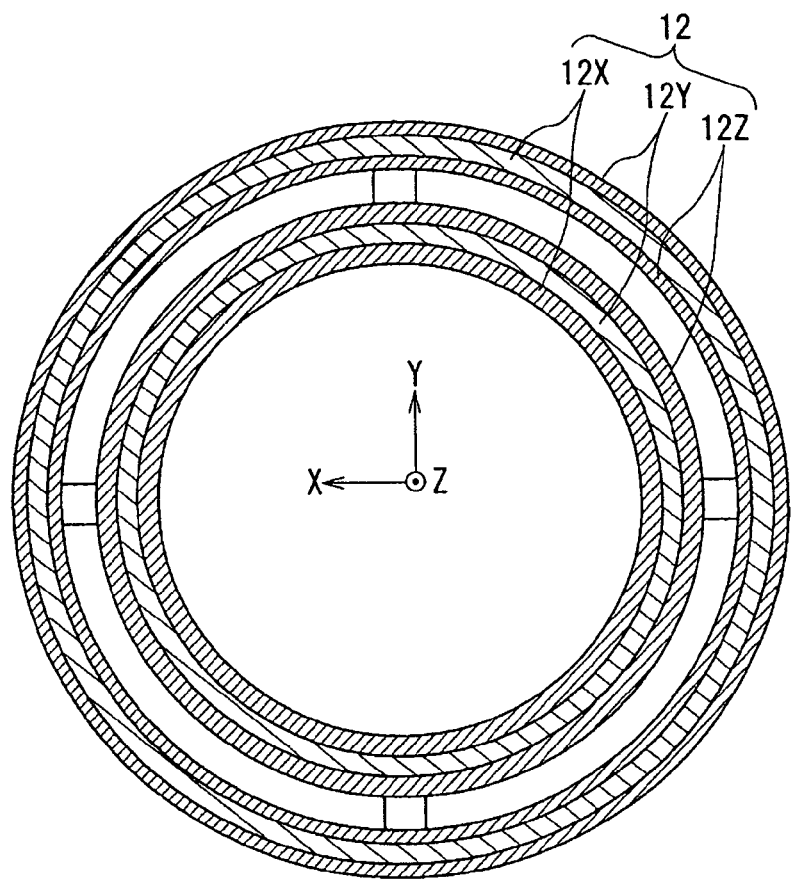
FIG. 2 is a sectional diagram showing a structural example of a gradient coil unit.

As shown in FIG. 2, in this actively shielded gradient coil (ASGC) unit 12, a X-gradient coil 12X to form a gradient magnetic field in the X-axis direction, a Y-gradient coil 12Y to form a gradient magnetic field in the Y-axis direction and a Z-gradient coil 12Z to form a gradient magnetic field in the Z-axis direction are laminated, being insulated per coil layer, to exhibit a substantially cylindrical general form.

Each of the X-gradient coil 12X, the Y-gradient coil 12Y and the Z-gradient coil 12Z has a main coil and a shield coil. The shield coil is shaped into a form substantially similar to that of its corresponding main coil and is disposed on the outer side of the main coil. The shield coil externally cancels the gradient magnetic field generated in each main coil to suppress the leakage of the magnetic field outside of the gradient coil unit 12 as much as possible.

The present invention mainly relates to the gradient coil 12Z in the Z-axis direction. Next, the gradient coil 12Z will be mainly described.

Figure 3:
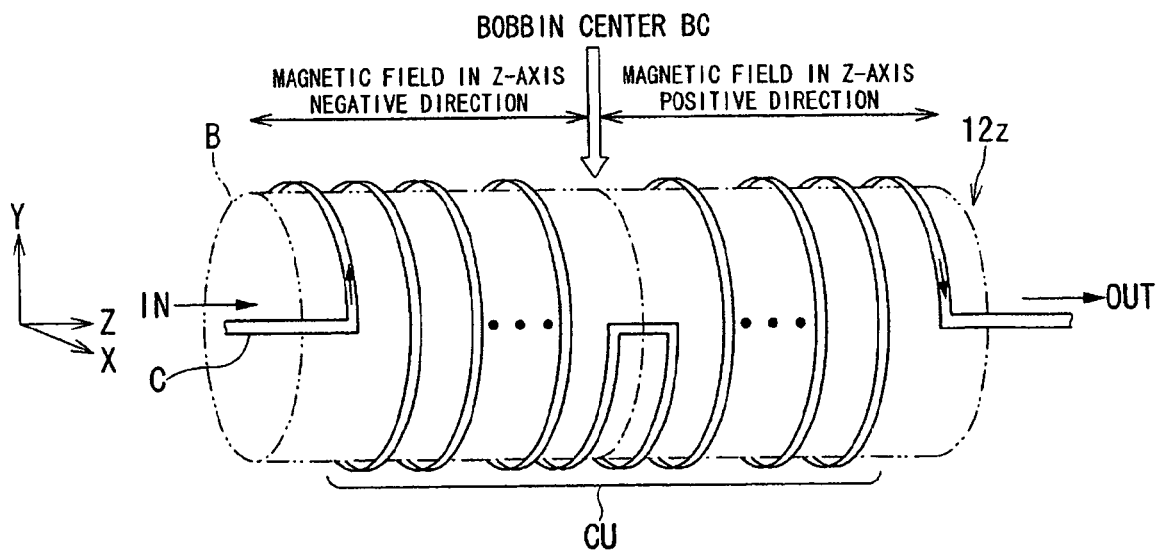
FIG. 3 is a schematic diagram showing a structure of a gradient coil.

FIG. 3 is a diagram schematically showing a structure of the gradient coil 12Z. The gradient coil 12Z has a substantially cylindrical bobbin B and a winding part CU. The winding part CU constitutes a one-layered winding coil by winding one conducting wire C round the bobbin by a plurality of turns. The conducting wire C is formed by a ribbon-shaped copper plate of a predetermined width and is capable of conducting large current while reducing its thickness in a radial direction.

The winding direction of the conducting wire is reversed at the center BC of the bobbin and hence the direction of the current flowing through the conducting wire is also reversed at the bobbin center BC. As a result, in a case where a current flows, for example, from the left end of the conducting wire C toward the right end thereof in FIG. 3, on the right side of the bobbin center BC, a magnetic field directed in the positive Z-axis direction is generated, and on the left side of the bobbin center BC, a magnetic field directed in the negative Z-axis direction is generated. As a result, a gradient magnetic field with the bobbin center BC set as the origin will be generated along the entire gradient coil 12Z.

As described above, the gradient coil 12Z is constituted by the main coil and the shield coil, each having, basically, the structure shown in FIG. 3. The diameter of the bobbin of the shield coil is made slightly larger than the diameter of the bobbin of the main coil such that the shield coil covers the outer circumference of the main coil. Although the wound form of the main coil is substantially similar to that of the shield coil, these coils are not completely equal to each other in the intervals (pitches) of turns, the position of each turn and the number of turns in order to effectively suppress the leakage magnetic field. Likewise, from the viewpoint of suppressing the leakage magnetic field, the shield coil is made slightly longer than the main coil in the length in the Z-axis direction.

As a method of winding the conducting wire C of the gradient coil 12Z, there have been conventionally proposed two methods as mentioned above. One is the method called the lane change winding and the other is the method called the spiral winding.

Figure 4:
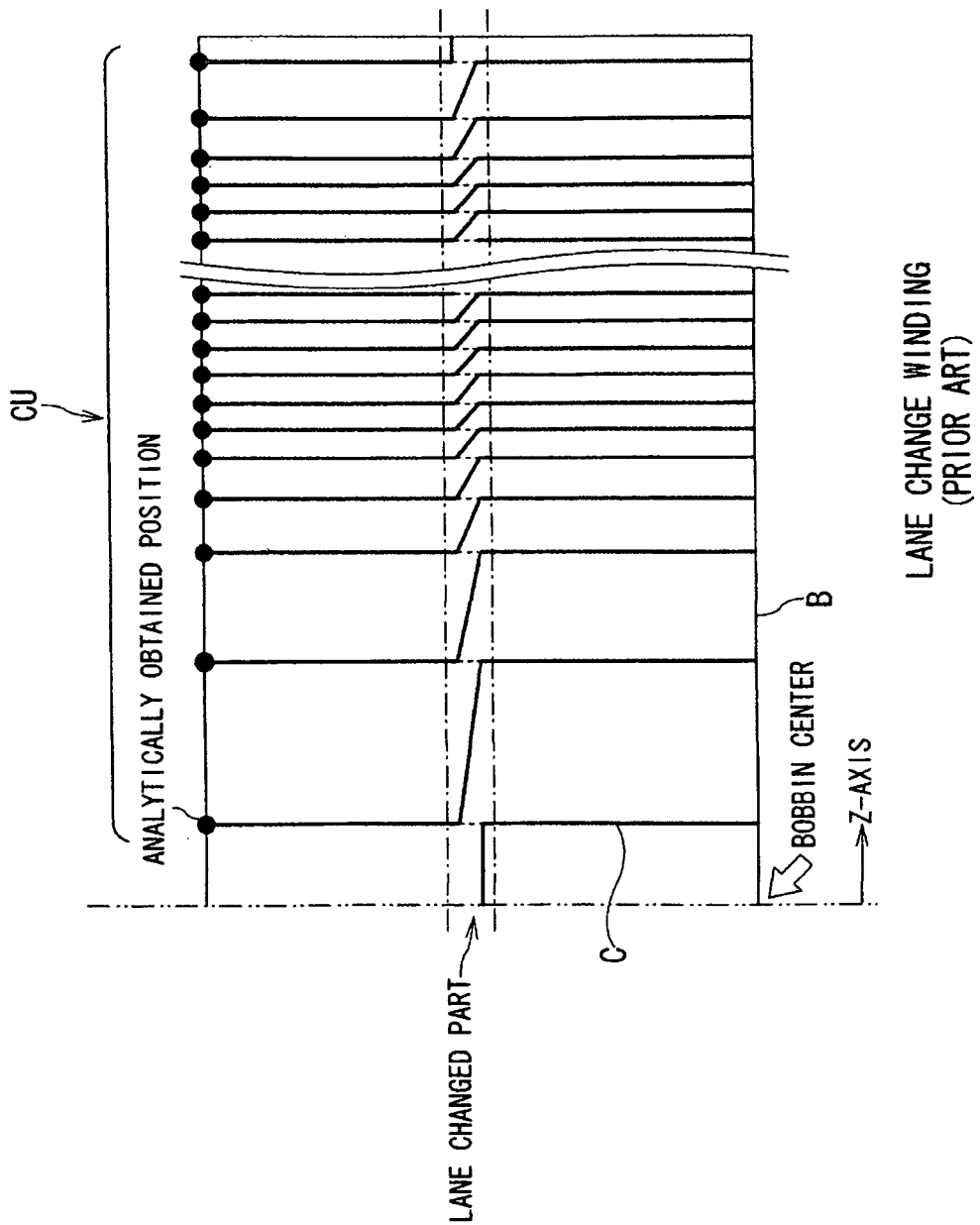
FIG. 4 is a diagram schematically showing an example of one conventional gradient coil winding method (entire region lane change winding)

FIG. 4 is a schematic diagram showing an example of conventionally proposed lane change winding. The wound form of the gradient coil 12Z is symmetric relative to the bobbin center BC, so that only one side of the coil relative to the bobbin center BC is shown in FIG. 4 (the same thing also applies to the succeeding drawings).

By the lane change winding, the conducting wire C is wound round the bobbin so as to be always perfectly orthogonal to the Z-axis except an extremely limited part (a lane changed part) on the circumference and shifting (lane changing) of the conducting wire in the Z-axis direction is performed only at the lane changed part.

In general, respective turns are irregularly spaced and the intervals of respective turns reach the thinnest states (the turns are spaced at widest intervals) in the vicinity of the bobbin center BC and become gradually denser from the bobbin center BC toward one end. The pitches reach the densest states at a predetermined distance away from the bobbin center and become gradually thinner after that.

The pitches of respective turns are made irregular in order to increase the linearity of the gradient magnetic field. The positions of respective turns are analytically determined in advance and the positions are shown by black dots in FIG. 4.

Figure 5:
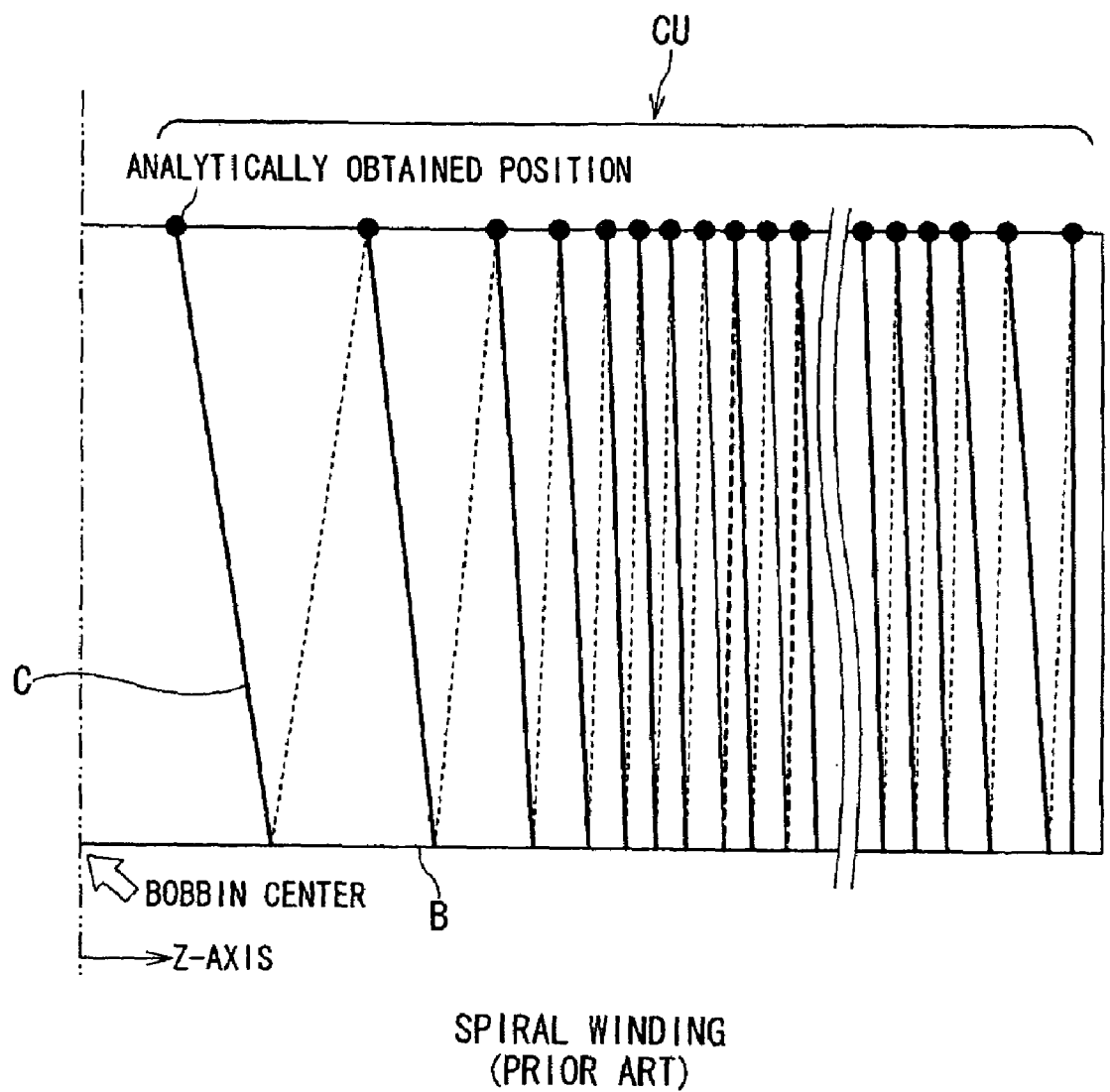
FIG. 5 is a diagram schematically showing an example of another conventional gradient coil winding method (entire region spiral winding)

On the other hand, FIG. 5 is a diagram schematically showing an example of conventionally proposed spiral winding, in which the conducting wire C is literally spirally wound round the bobbin over the entire region of the winding part CU. By the spiral winding, the conducting wire C is spirally wound round the bobbin while skewing in the Z-axis direction, not orthogonal to the Z-axis direction.

Incidentally, since a pulsed current is applied to the gradient coil 12Z, if a leakage magnetic field is present, an eddy current will generate in an electro-conductive element on the outer side of the gradient coil 12Z due to the presence of the leakage magnetic field. Then, the eddy current induces generation of a not-intended unnecessary magnetic field. In order to avoid the generation of the not-intended unnecessary magnetic field induced by the eddy current, the leakage magnetic field is needed to be removed and the shield coil is provided for this purpose.

However, it is difficult even for the shield coil to completely remove the leakage magnetic field and it has been found that a not-negligible unnecessary magnetic field may be generated by the eddy current depending on the distribution and the magnitude of the leakage magnetic field.

FIG. 6B is a diagram showing an example of the leakage magnetic field distribution and the eddy current generated by the leakage magnetic field by the lane change winding (FIG. 6A). FIG. 6D is a diagram showing an example of the leakage magnetic field distribution and the eddy current generated by the leakage magnetic field by the spiral winding (FIG. 6C).

As apparent from these drawings, regardless of which winding is adopted, the lane change winding or the spiral winding, in a region where the intervals (the pitches) of respective turns of the conducting wire are dense, the leakage magnetic field is hardly generated. The reason therefor lies in that in the region where the intervals of respective turns of the main coil are dense, the intervals of turns of the shield coil are also dense and hence shielding ability with the shield coil to shield the leakage magnetic field is sufficiently high.

On the other hand, in a region where the intervals of respective turns are thin, the intervals of turns of the shield coil are also thin, so that it becomes impossible to completely suppress the leakage magnetic field. Both by the lane change winding and the spiral winding, in the region where the pitches of turns are thin, the leakage magnetic field is comparatively strong. However, from the viewpoint of distribution of the leakage magnetic field, the lane change winding is remarkably different from the spiral winding in the aspect of distribution of the leakage magnetic field.

By the lane change winding, the leakage magnetic field (the contour line of the magnetic field) distributes orthogonal to the Z-axis direction. Therefore, the eddy current, as shown by an arrow in FIG. 6B, generated by the leakage magnetic field orients in the same direction on the circumference and hence no unnecessary magnetic field (the ZX magnetic field or the ZY magnetic field) is generated.

To the contrary, by the spiral winding, the distribution of the leakage magnetic field is inclined relative to the Z-axis direction. Due to the presence of the leakage magnetic field of inclined distribution, an eddy current is generated, as shown by two arrows in FIG. 6D, in a reverse direction relative to the circumferential direction. Due to the presence of this reverse-oriented eddy current, a non-uniform unnecessary magnetic field (the ZX magnetic field or the ZY magnetic field) is generated in the X-axis direction (or in the Y-axis direction).

FIGS. 7A, 7B and 7C are diagrams illustrating a mechanism of generating an unnecessary magnetic field by the spiral winding. FIG. 7C is equivalent to FIG. 6D. Due to the presence of the reverse-oriented eddy current induced by the spiral winding, differently oriented eddy currents generate at differently angled positions (for example, the positions at angles of 0° and 180°) on the circumference (FIG. 7B).

As a result, as shown in FIG. 7A, differently oriented parasitic magnetic fields are generated in the gradient coil 12Z to generate an unnecessary magnetic field inclined in the X-axis direction (or the Y-axis direction).

This unnecessary magnetic field is originally a not-intended magnetic field which induces not-intended non-uniformity in the magnetic field in the X-axis direction (or the Y-axis direction) and as a result of which a not-intended non-uniform density distribution is generated in a sectional image taken in the X-axis direction (or the Y-axis direction).

In order to solve this problem, according to this embodiment of the present invention, the lane change winding is combined with the spiral winding to realize the gradient coil 12Z capable of compensating for the drawbacks of the both winding methods and effectively utilizing their advantages.

Figure 8:
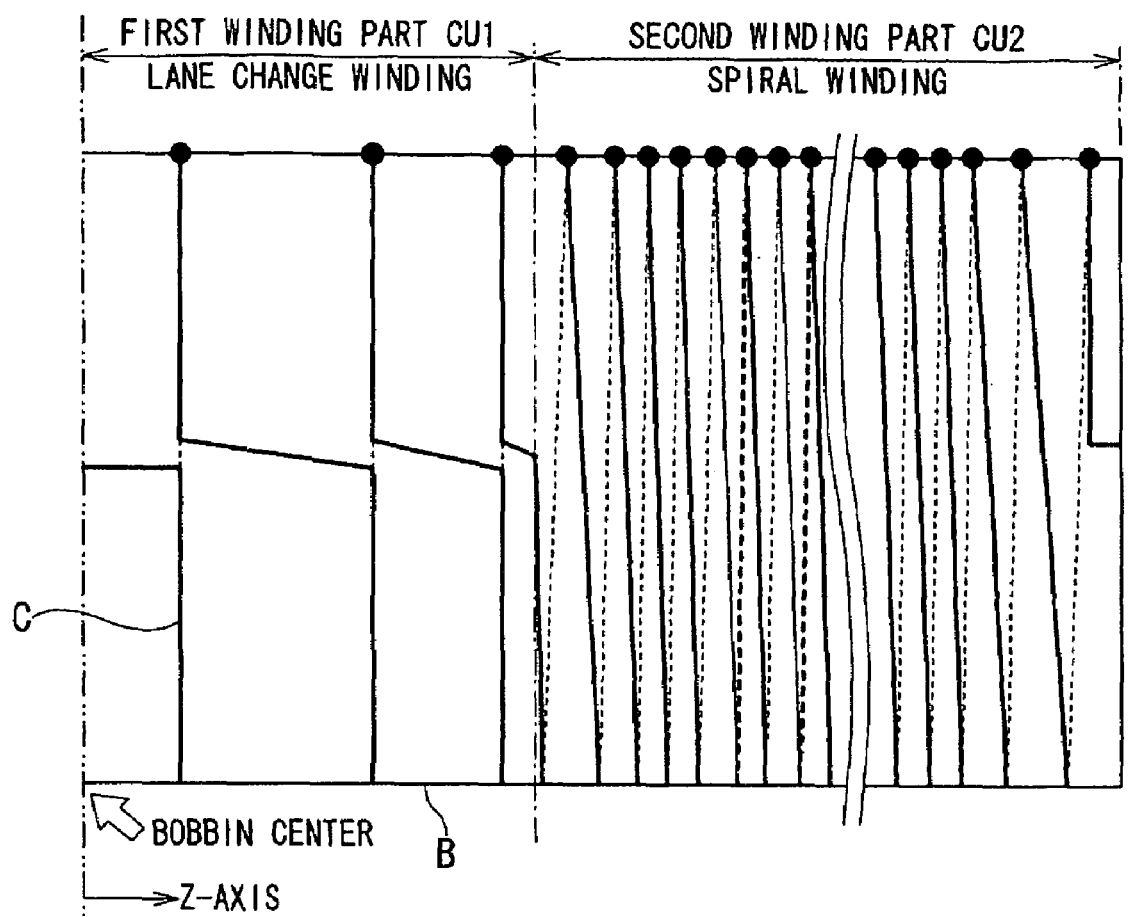
FIG. 8 is a schematic diagram showing a structure of a gradient coil according to the embodiment of the present invention.

FIG. 8 is a diagram schematically showing a method of winding the gradient coil 12Z according to the embodiment of the present invention. In the gradient coil 12Z according to this embodiment, the winding part CU is constituted by a first winding part CU1 and a second winding part CU2. In the first winding part CU1, the conducting wire C is wound round the bobbin by the lane change winding and in the second winding part CU2, the conducting wire C is wound round the bobbin by the spiral winding.

The first winding part CU1 is disposed in a region where the turns of the conducting wire C are spaced at wide intervals (at thin pitches) and the second winding CU2 is disposed in a region where the turns of the conducting wire C are spaced at narrow intervals (at dense pitches).

As described above, in the region where the turns are spaced at thin pitches, the leakage magnetic field tends to be strong. However, by using the lane change winding in this region, generation of the unnecessary magnetic field (the ZX magnetic field or the ZY magnetic field) can be prevented. In addition, due to the widely spaced pitches of the turns, even if the lane change winding is performed, the workability of the conducting wire winding work will not be deteriorated so much.

On the other hand, in the region where the turns are spaced at dense pitches, the leakage magnetic field is small both by the lane change winding and the spiral winding and hence the spiral winding which is excellent in workability is more advantageously used.

As described above, according to this embodiment, by combining the Lane change winding with the spiral winding, there can be provided the gradient coil 12Z which is excellent in workability of the conducting wire winding work (that is, the time required for the winding work can be reduced) and which is reduced in generation of the unnecessary magnetic field (the ZX magnetic field or the ZY magnetic field). As a result, there can be realized the magnetic resonance imaging apparatus 1 capable of generating an image of high quality at a low cost.

In the above mentioned description, the region where the turns are spaced at thin pitches (of a value larger than a predetermined threshold value) is set as the region of the first winding part CU1 and the region where the turns are spaced at dense pitches (of a value smaller than the predetermined threshold value) is set as the region of the second winding part CU2.

As an alternative, as shown in FIG. 6D or the like, the magnitude of the leakage magnetic field may be analytically determined in advance, and a region where the magnitude of the leakage magnetic field is larger than a predetermined threshold value may be set as the region of the first winding part CU1 and a region where the magnitude of the leakage magnetic field is smaller than the predetermined threshold value may be set as the region of the second winding part CU2.

Figure 9A:
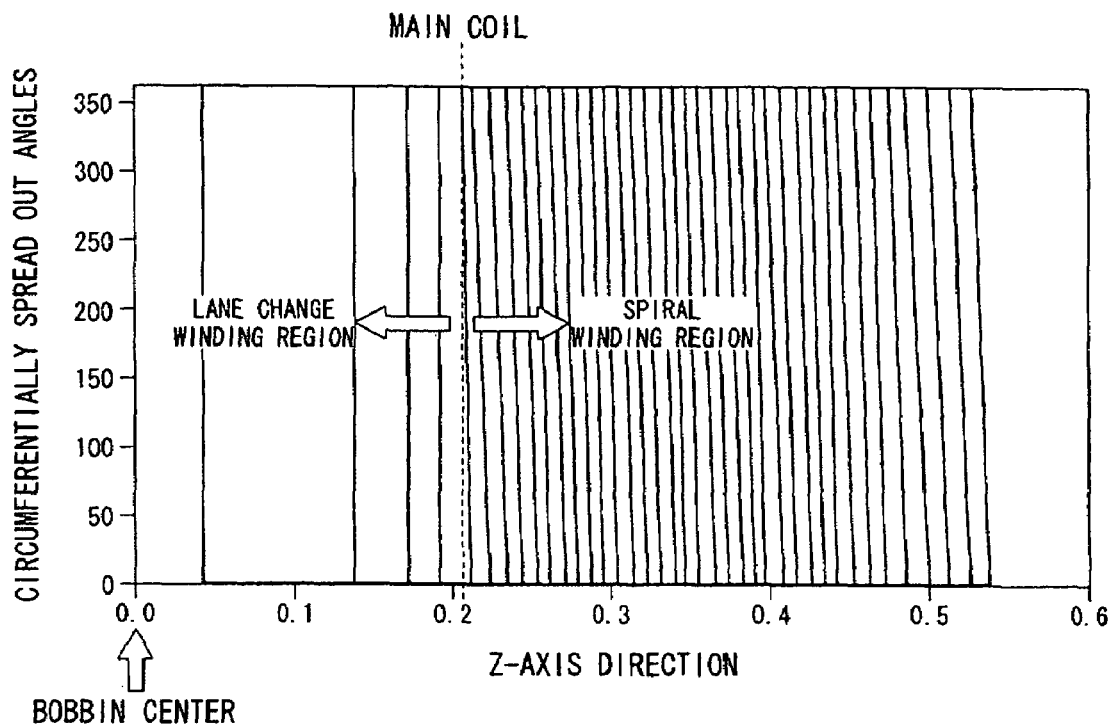
FIGS. 9A and 9B are diagrams showing specific examples of winding structures of the gradient coil according to the embodiment of the present invention.
Figure 9B:
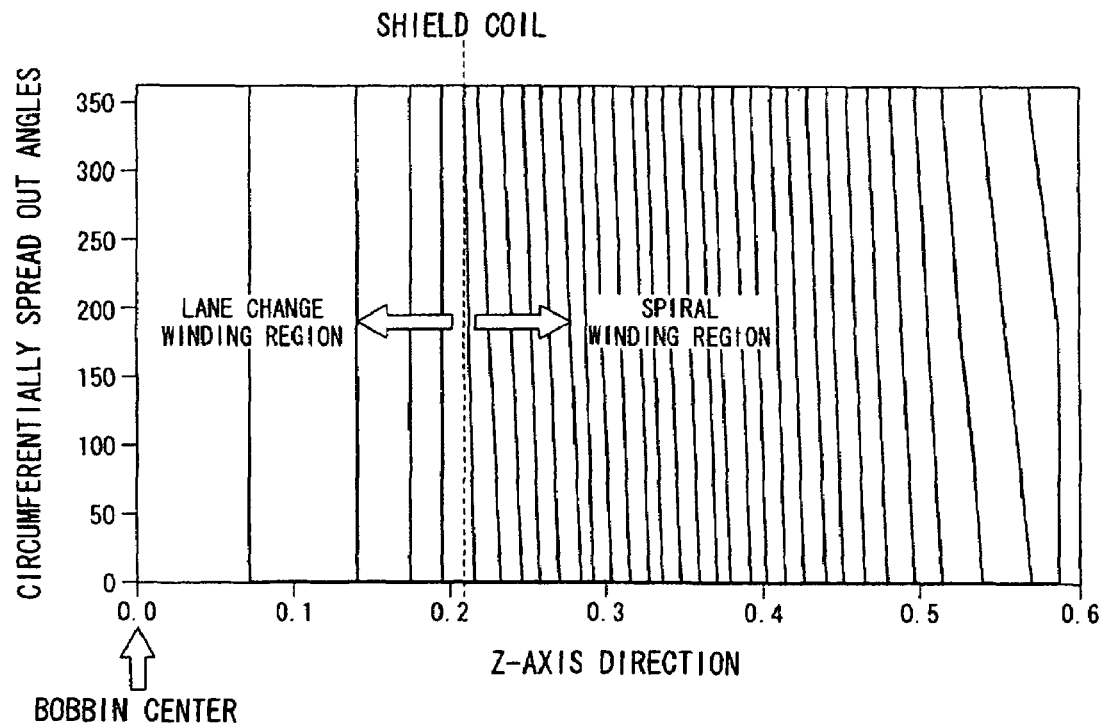
Figure 10:
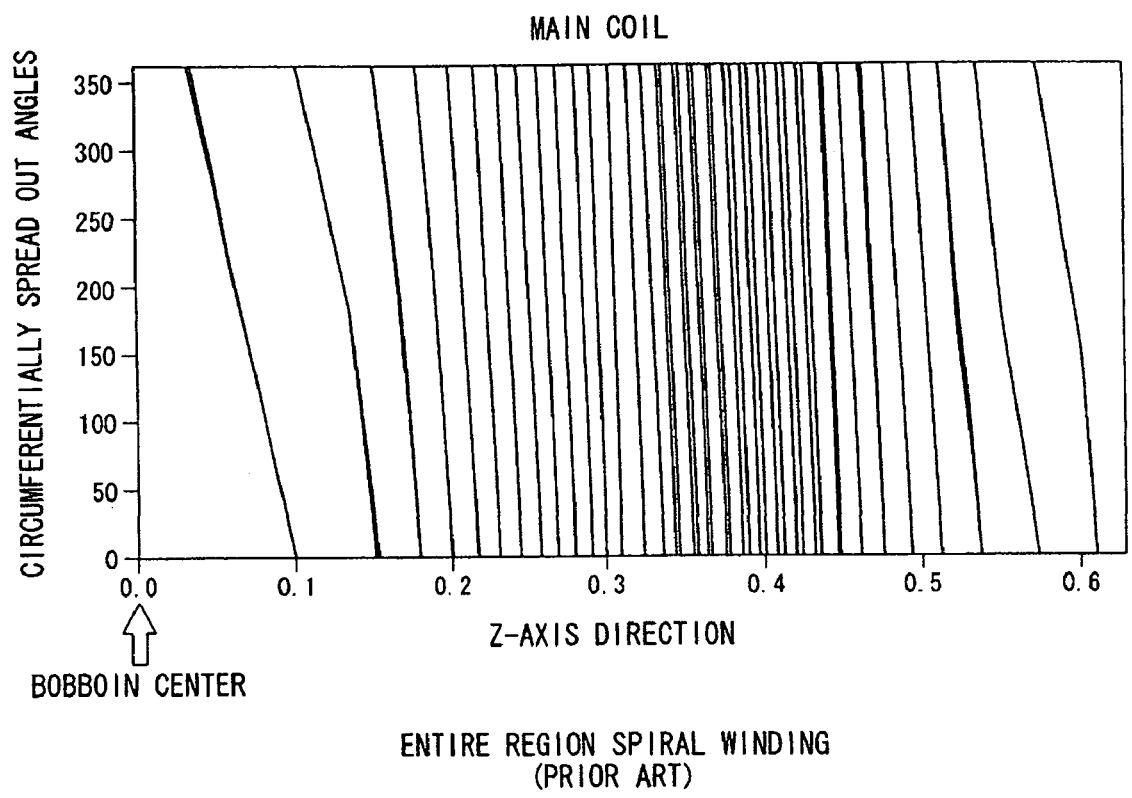
FIG. 10 is a diagram showing a winding structure of the conventional entire region spiral winding as a comparative example to be compared with the winding structure according to the embodiment of the present invention.

FIGS. 9 to 11 are diagrams showing more specific winding examples of the gradient coil 12Z according to this embodiment and effects thereof.

FIG. 9A shows a specific example obtained when the gradient coil 12Z according to this embodiment is applied to the main coil. A region occupying an area of about 40% of the entire area measured from the bobbin center in the Z-axis direction (corresponding to about 0.2 on the scale of the Z-axis direction of FIG. 9A) is set for the first winding part CU1 (that is, the lane change winding is adopted) and a region occupying an area on the outer side of the 40%-area region is set for the second winding part CU2 (that is, the spiral winding is adopted). The positions of respective turns are analytically determined so as to obtain a desired Z-axis gradient magnetic field.

FIG. 9B shows a specific example obtained when the gradient coil 12Z according to this embodiment is applied to the shield coil. The shield coil is made slightly longer than the main coil in the Z-axis direction. The positions of respective turns are analytically determined so as to minimize the leakage magnetic field.

As apparent from FIGS. 9A and 9B, with respect to the length of the second winding part CU2 (the spiral winding is adopted) in the axial direction of the bobbin, the shield coil is made longer than the main coil to suppress the leakage magnetic field from the second winding part CU2 of the main coil. As to the pitches at which each winding of the second winding part CU2 is wound, the shield coil is made wider than the main coil to, likewise, suppress the leakage magnetic field from the second winding part CU2 of the main coil.

On the other hand, with respect to the first winding part CU1 (the lane change winding is adopted), the number of turns of the shield coil is the same as, or less than, that of the main coil corresponding to each other and the position of each winding of the shield coil is situated farther away from the center of the bobbin than the position of each winding of the corresponding main coil. Owing to this arrangement of the windings, the leakage magnetic field from the first winding part CU1 of the main coil can be suppressed.

FIG. 10 shows an example of a coil using a conventional winding method (the coil is spirally wound over the entire region) in order to obtain substantially the same Z-axis gradient magnetic field for comparison with the gradient coil 12Z (FIG. 9) according to this embodiment.

FIG. 11 is a table showing an effect to reduce the unnecessary magnetic field (the ZX magnetic field or the ZY magnetic field) with the gradient coil 12Z according to this embodiment, in which the unnecessary magnetic field is analytically obtained.

In the row of the table designated by the number 1, the Z-axis magnetic field component and the unnecessary magnetic field (the ZX magnetic field or the ZY magnetic field) obtained by the conventional winding method (the spiral winding is performed over the entire region) are shown, and in the row designated by the number 2, the Z-axis magnetic field component and the unnecessary magnetic field (the ZX magnetic field or the ZY magnetic field) of the gradient coil 12Z according to this embodiment are shown.

Although there logically exists a coil in which the lane change winding is performed over the entire region as a conventional winding method, the workability thereof is extremely worsened in a region where the turns are spaced at dense pitches and in some cases this coil cannot be realized as a product, so that this coil is excluded from the objects to be compared.

The analytical result in FIG. 11 shows that in the gradient coil 12Z according to this embodiment, the unnecessary magnetic field component is substantially halved in the ZX magnetic field and is substantially reduced to zero in the ZY magnetic field as compared with the prior art.

As described above, according to the gradient coil 12Z, the magnetic resonance imaging apparatus 1 and the gradient coil manufacturing method of the embodiments of the present invention, the generation of the unnecessary magnetic field component can be suppressed while ensuring the readiness of conducting wire winding work.

It should be noted that the present invention is not explicitly limited to the above-mentioned embodiments, and the present invention can be embodied in the implementing stage by modifying the components without departing from the scope of the invention. Also, various embodiments of the invention can be formed by appropriately combining the disclosed components of the above-mentioned embodiments. For example, some of the components may be deleted from all of the disclosed components according to the embodiments. Furthermore, components from different embodiments may be appropriately combined.

What is claimed is:

1. A gradient coil comprising:
   a cylindrical bobbin; and
   a winding part formed by winding a conducting wire round the bobbin by a plurality of turns,
   wherein the winding part includes
   a first winding part in which the conducting wire is wound round the bobbin orthogonal to the axis of the bobbin in a circumferential direction of the bobbin and
   a second winding part in which the conducting wire is spirally wound round the bobbin, skewing relative to the axis of the bobbin in the circumferential direction of the bobbin.

2. The gradient coil according to claim 1, wherein
   the first winding part is provided in a region where respective turns of the conducting wire are wound at intervals of a value larger than a predetermined value, and
   the second winding part is provided in a region where respective turns of the conducting wire are wound at intervals of a value smaller than the predetermined value.

3. The gradient coil according to claim 1, wherein
   the gradient coil is at least one of a main coil and a shield coil constituting an actively shielded gradient coil.

4. The gradient coil according to claim 2, wherein the gradient coil is at least one of a main coil and a shield coil constituting an actively shielded gradient coil.

5. The gradient coil according to claim 1, wherein
   in a case where the gradient coil is used as at least one of a main coil and a shield coil constituting an actively shielded gradient coil,
   the first winding part is provided in a region where the magnitude of a leakage magnetic field is of a value larger than a predetermined value, and
   the second winding part is provided in a region where the magnitude of the leakage magnetic field is of a value smaller than the predetermined value.

6. The gradient coil according to claim 2, wherein
   in a case where the gradient coil is used as at least one of a main coil and a shield coil constituting an actively shielded gradient coil,
   the first winding part is provided in a region where the magnitude of a leakage magnetic field is of a value larger than a predetermined value, and
   the second winding part is provided in a region where the magnitude of the leakage magnetic field is of a value smaller than the predetermined value.

7. The gradient coil according to claim 1, wherein
   the first winding part is provided at the center of the bobbin,
   the second winding part is provided on the outer side of the first winding part, succeeding to each of ends of the first winding part, and
   windings of the first and second winding parts are wound in roll symmetric to the axial center of the bobbin.

8. The gradient coil according to claim 7, wherein
   in a case where the gradient coil is used as both of a main coil and a shield coil constituting an actively shielded gradient coil,
   with respect to the length of the second winding part in the axial direction of the bobbin, the shied coil is longer than the main coil.

9. The gradient coil according to claim 7, wherein,
   in a case where the gradient coil is used as both of a main coil and a shield coil constituting an actively shielded gradient coil,
   with respect to the pitches at which each winding of the second winding part is wound, the shield coil is wider than the main coil.

10. The gradient coil according to claim 7, wherein
    in a case where the gradient coil is used as both of a main coil and a shield coil constituting an actively shielded gradient coil,
    the number of turns of each winding of the first winding part of the shield coil is the same as that of each winding of the first winding part of the main coil corresponding to each other, and
    the position of each winding of the shield coil is situated farther away from the center of the bobbin than the position of each winding of the corresponding main coil.

11. The gradient coil according to claim 7, wherein
    the length of the first winding part in an axial direction of the bobbin is substantially equal to 40% of the length of the winding part in the axial direction of the bobbin.

12. A magnetic resonance imaging apparatus comprising:
    a magneto-static field coil adapted to apply a magneto-static field to a person to be inspected;
    a gradient coil adapted to form a gradient magnetic field in a direction which is the same as the direction in which the magneto-static field is applied to apply the gradient magnetic field to the person to be inspected;
    a high frequency coil adapted to receive a magnetic resonance signal emitted from the person to be inspected; and
    a signal image processing unit adapted to process the received magnetic resonance signal to generate an image of the inside of the person to be inspected, wherein
- the gradient coil includes
- a cylindrical bobbin and
- a winding part formed by winding a conducting wire round the bobbin by a plurality of turns, and
- the winding part includes
- a first winding part in which the conducting wire is wound round the bobbin orthogonal to the axis of the bobbin in a circumferential direction of the bobbin and
- a second winding part in which the conducting wire is wound round the bobbin, skewing relative to the axis of the bobbin in the circumferential direction of the bobbin.

13. The magnetic resonance imaging apparatus according to claim 12, wherein
- the first winding part is provided in a region where respective turns of the conducting wire are wound at intervals of a value larger than a predetermined value, and
- the second winding part is provided in a region where respective turns of the conducting wire are wound at intervals of a value smaller than the predetermined value.

14. The magnetic resonance imaging apparatus according to claim 12, wherein
- the gradient coil is at least one of a main coil and a shield coil constituting an actively shielded gradient coil.

15. The magnetic resonance imaging apparatus according to claim 13, wherein
- the gradient coil is at least one of a main coil and a shield coil constituting an actively shielded gradient coil.

16. The magnetic resonance imaging apparatus according to claim 12, wherein
- in a case where the gradient coil is used as at least one of a main coil and a shield coil constituting an actively shielded gradient coil,
- the first winding part is provided in a region where the magnitude of a leakage magnetic field is of a value larger than a predetermined value, and
- the second winding part is provided in a region where the magnitude of the leakage magnetic field is of a value smaller than the predetermined value.

17. The magnetic resonance imaging apparatus according to claim 12, wherein
- the first winding part is provided at the center of the bobbin,
- the second winding part is provided on the outer side of the first winding part, succeeding to each of ends of the first winding part, and
- windings of the first and second winding parts are wound in roll symmetric to the axial center of the bobbin.

18. The magnetic resonance imaging apparatus according to claim 17, wherein
- in a case where the gradient coil is used as both of a main coil and a shield coil constituting an actively shielded gradient coil,
- with respect to the length of the second winding part in an axial direction of the bobbin, the shield coil is longer than the main coil.

19. The magnetic resonance imaging apparatus according to claim 17, wherein
- in a case where the gradient coil is used as both of a main coil and a shield coil constituting an actively shielded gradient coil,
- with respect to the pitches at which each winding of the second winding part is wound, the shield coil is wider than the main coil.

20. A gradient coil manufacturing method of forming a winding part by winding a conducting wire round a cylindrical bobbin by a plurality of turns, the method comprising the steps of:
- (a) forming a first winding part by winding the conducting wire round the bobbin orthogonal to the axis of the bobbin in a circumferential direction of the bobbin and
- (b) forming a second winding part by spirally winding the conducting wire round the bobbin, skewing relative to the axis of the bobbin in the circumferential direction of the bobbin.

* * * * *